United States Patent
Iruvanti et al.

(10) Patent No.: US 10,892,233 B2
(45) Date of Patent: Jan. 12, 2021

(54) MITIGATING MOISTURE-DRIVEN DEGRADATION OF FEATURES DESIGNED TO PREVENT STRUCTURAL FAILURE OF SEMICONDUCTOR WAFERS

(71) Applicant: INTERNATIONAL BUSINESS MACHINES CORPORATION, Armonk, NY (US)

(72) Inventors: Sushumna Iruvanti, Wappingers Falls, NY (US); Shidong Li, Poughkeepsie, NY (US); Steve Ostrander, Poughkeepsie, NY (US); Jon Alfred Casey, Poughkeepsie, NY (US); Brian Richard Sundlof, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/177,100

(22) Filed: Oct. 31, 2018

(65) Prior Publication Data

US 2020/0135662 A1     Apr. 30, 2020

(51) Int. Cl.
| | |
|---|---|
| H01L 23/00 | (2006.01) |
| H01L 21/02 | (2006.01) |
| H01L 23/26 | (2006.01) |
| H01L 21/768 | (2006.01) |

(52) U.S. Cl.
CPC ........ *H01L 23/564* (2013.01); *H01L 21/0254* (2013.01); *H01L 21/76877* (2013.01); *H01L 23/26* (2013.01); *H01L 23/562* (2013.01); *H01L 24/16* (2013.01); *H01L 2924/35121* (2013.01)

(58) Field of Classification Search
None
See application file for complete search history.

(56) References Cited

U.S. PATENT DOCUMENTS

| | | |
|---|---|---|
| 5,593,925 A | 1/1997 | Yamaha |
| 6,383,893 B1 | 5/2002 | Begle et al. |
| 7,098,544 B2 | 8/2006 | Edelstein et al. |
| 7,235,864 B2 | 6/2007 | Lee |
| 7,871,902 B2 | 1/2011 | Kaltalioglu |
| 7,939,913 B2 | 5/2011 | Watanabe et al. |
| 7,955,955 B2 | 6/2011 | Lane et al. |
| 9,679,855 B1 * | 6/2017 | Lee ..................... H01L 23/3178 |
| 10,191,215 B2 * | 1/2019 | Kippenberg .............. H01P 3/16 |

(Continued)

OTHER PUBLICATIONS

Jonas Hedlund, "Thin Films of Molecular Sieves: Synthesis and Applications", Lulea Tekniska Universitet. Oct. 1998. pp. 1-53.

(Continued)

*Primary Examiner* — Long Pham
(74) *Attorney, Agent, or Firm* — Steven Meyers; Otterstedt, Wallace & Kammer, LLP

(57) ABSTRACT

Moisture-driven degradation of a crack stop in a semiconductor die is mitigated by forming a groove in an upper surface of the die between an edge of the die and the crack stop; entirely filling the groove with a moisture barrier material; preventing moisture penetration of the semiconductor die by presence of the moisture barrier material; and dissipating mechanical stress in the moisture barrier material without presenting a stress riser in the bulk portion of the die. The moisture barrier material is at least one of moisture-absorbing, moisture adsorbing, and hydrophobic.

7 Claims, 4 Drawing Sheets

(56) References Cited

U.S. PATENT DOCUMENTS

| | | | | |
|---|---|---|---|---|
| 2005/0127495 A1* | 6/2005 | Zhang | ................ | H01L 23/3178 |
| | | | | 257/700 |
| 2007/0102821 A1* | 5/2007 | Papa Rao | ........... | H01L 23/5329 |
| | | | | 257/758 |
| 2009/0081379 A1* | 3/2009 | Nawrocki | .............. | C09D 11/36 |
| | | | | 427/541 |
| 2012/0299126 A1* | 11/2012 | Daamen | ............... | G01N 27/223 |
| | | | | 257/414 |
| 2013/0062727 A1* | 3/2013 | Huang | .................. | H01L 23/562 |
| | | | | 257/506 |
| 2016/0211227 A1* | 7/2016 | Wagner | ................ | H01L 23/562 |

OTHER PUBLICATIONS

Zeochem. "Molecular Sieve Adsorbents". Zeochem AG. https://www.zeochem.ch/dev/pdf/brochure_ms_adsorbents.pdf. downloaded Oct. 2018. pp. 1-8.

\* cited by examiner

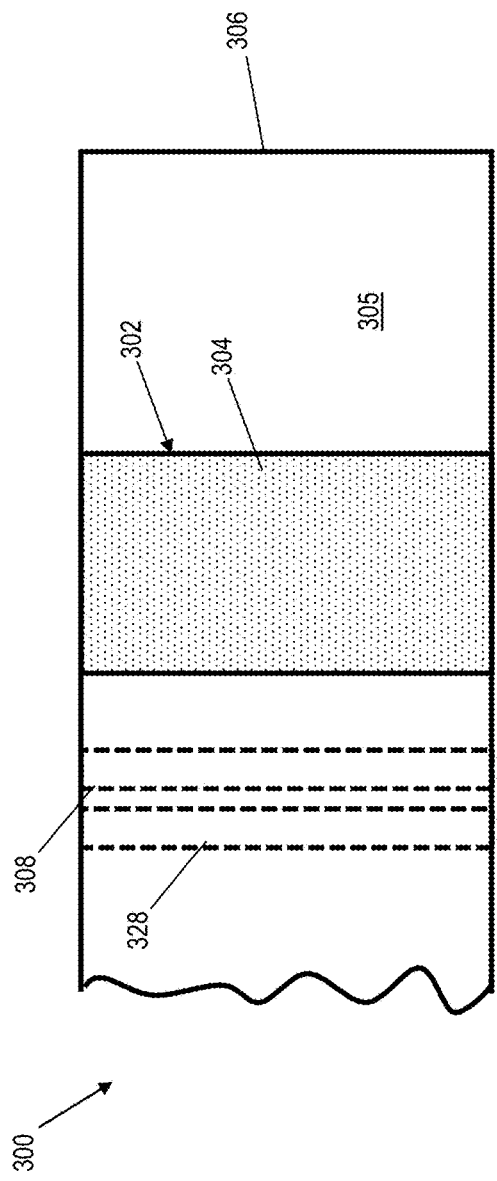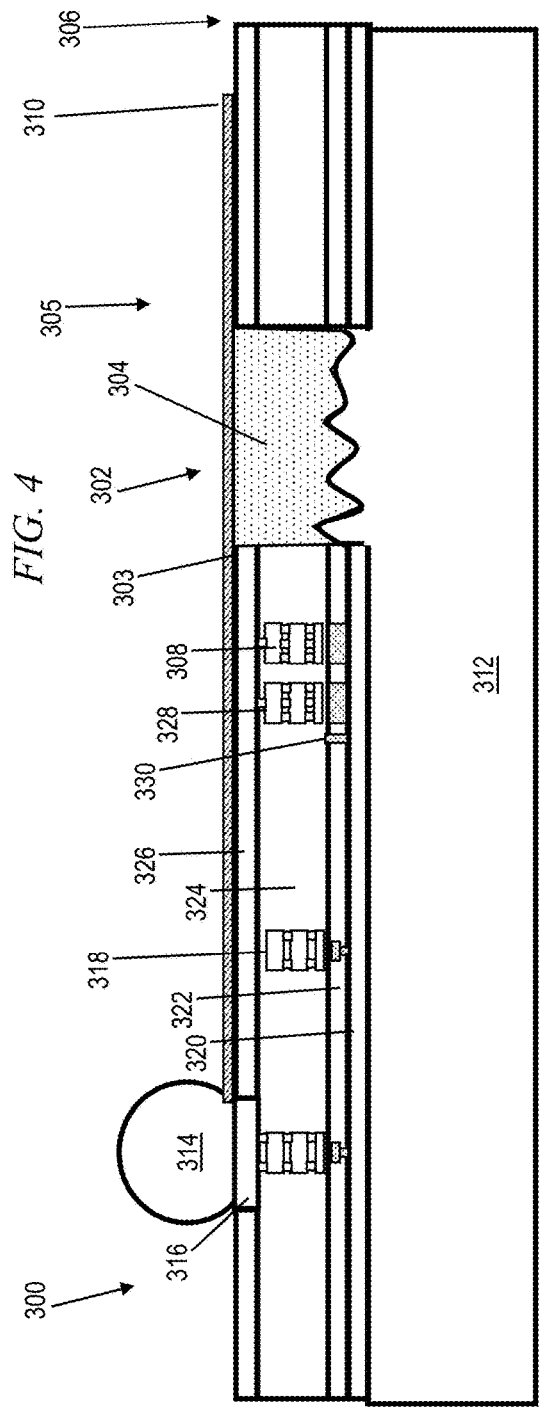
FIG. 4
FIG. 3

MITIGATING MOISTURE-DRIVEN DEGRADATION OF FEATURES DESIGNED TO PREVENT STRUCTURAL FAILURE OF SEMICONDUCTOR WAFERS

BACKGROUND

The present invention relates to the electrical, electronic, and computer arts, and more specifically, to manufacturing semiconductor wafers and packages.

During singulation of dies from a wafer, the cutting action introduces residual stresses at the die edges. The residual stresses gradually propagate cracks toward the center of a die. Various measures have been taken to mitigate crack propagation in semiconductor dies, including the provision of a crack stop running parallel to the die edge. Typically, the crack stop is a structure built into the wafer prior to singulation, in order to prevent propagation of cracks from die edges across the die. Additionally, a laser groove can be provided between the crack stop and the die edge in order to arrest cracks caused by the mechanical strain of blade singulation. The laser groove, however, can introduce thermal strains that also can initiate cracks.

Crack stops are provided to stop the cracks from propagating. There also may be a moisture barrier provided inboard of the crack stop to prevent moisture ingress. These measures address protections for failures immediately associated with wafer dicing. However, there is a need to mitigate the weakening of crack stop BEOL (back end of the line) structures by moisture penetration/diffusion during long-term field use conditions or accelerated lab testing This structural weakening by moisture over extended duration of field use, allows the micro cracks to completely by-pass the crack stop bulk as well as the inboard moisture barrier and propagate underneath the crack stop through the moisture degraded BEOL and reach the active circuitry inside.

SUMMARY

Principles of the invention provide techniques for mitigating moisture-driven degradation of features (e.g., crack stops) designed to prevent electrical or structural failure of semiconductor dies. In one aspect, an exemplary method includes forming a groove in an upper surface of a semiconductor die between an edge of the die and a crack stop that extends parallel to the edge of the die, the groove being formed outboard of the crack stop; and depositing a moisture barrier material into the groove to entirely fill the groove.

In another aspect, an exemplary apparatus includes a semiconductor die having an edge; a crack stop, formed in the die, that extends parallel to the die edge; a groove, formed in an upper surface of the die, that extends parallel to the crack stop between the crack stop and the die edge; and a moisture barrier material that fills the entire depth of the groove.

In another aspect, an exemplary method is provided of mitigating moisture-driven degradation of a crack stop in a semiconductor die having a bulk portion. The method includes forming a groove in an upper surface of the die between an edge of the die and the crack stop; and entirely filling the groove with a moisture barrier material. The moisture barrier material is moisture-absorbing, moisture adsorbing, and/or hydrophobic. Further steps include preventing moisture penetration of the semiconductor die by presence of the moisture barrier material; and dissipating mechanical stress in the moisture barrier material without presenting a stress riser in the bulk portion of the die.

In view of the foregoing, techniques of the present invention can provide substantial beneficial technical effects. For example, one or more embodiments provide one or more of:

Mitigation of crack stop strength degradation and eventual failure due to moisture ingress;

Resulting enhanced moisture resistance of a semiconductor die;

Resulting reduced crack propagation in a semiconductor die.

These and other features and advantages of the present invention will become apparent from the following detailed description of illustrative embodiments thereof, which is to be read in connection with the accompanying drawings.

BRIEF DESCRIPTION OF THE DRAWINGS

FIG. 3 depicts an elevation view of a semiconductor die with a laser etched groove that is filled by a moisture barrier material, according to an exemplary embodiment;

FIG. 4 depicts a partial top view of the semiconductor die shown in FIG. 3;

DETAILED DESCRIPTION

Crack stops are designed to reduce or eliminate the propagation of mechanical damage beyond the crack stop and into the actual active circuitry of a semiconductor die. Initial damage can occur from the dicing operation; typically micro-cracks from the mechanical blade. Laser grooving can also cause issues.

Moisture-induced degradation of electrical characteristics, or mechanical delamination, or cracking of interlayer dielectric films, or oxidation of metal layers, are long known problems in the operation of semiconductor components. These problems are exacerbated by moisture penetration into the substrate of a semiconductor device, for example via microcracks that were formed during manufacture of the device during mechanical blade singulation or laser groove etching. In the substrate, moisture reacts chemically with the substrate which may impact its electrical characteristics, or mechanical properties such as its elastic modulus, coefficient of thermal expansion (CTE), etc. during normal operation temperature variations. Further, ultra-low dielectric constant (ULK) interlayer dielectric films used in semiconductor nodes may be more prone to moisture induced degradation.

We have recognized that the moisture barrier benefits of thin film moisture barriers can be impaired by cyclic mechanical stresses. These stresses cause crack propagation through the substrate, by going around the crack stops that are provided to arrest propagation of cracks produced by the mechanical blade singulation. Thus, these stresses permit moisture infiltration deep into the circuitry of a semiconductor die.

Figure 1:
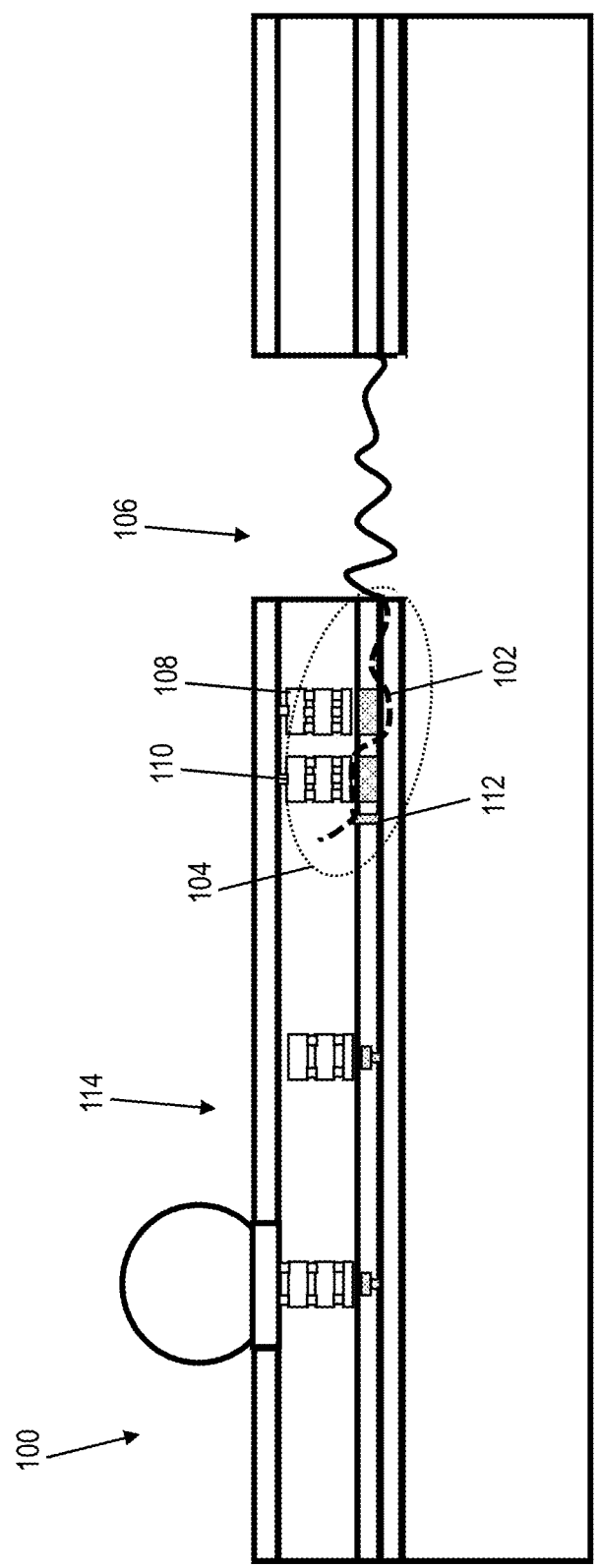
FIG. 1 depicts a semiconductor die with moisture induced cracking around a crack stop.

FIG. 1 depicts a semiconductor die 100 with moisture induced cracking around a crack stop. Notably, the cracking (shown in dashed line 102 within dotted ellipse 104) extends from a microcrack starting at a laser groove 106 formed in the die, past two crack stops 108, 110 and a moisture barrier 112, into the active circuitry portion 114 of the semiconductor die. Although not common, such extensive crack propagation can result in circuit failure.

Figure 2:
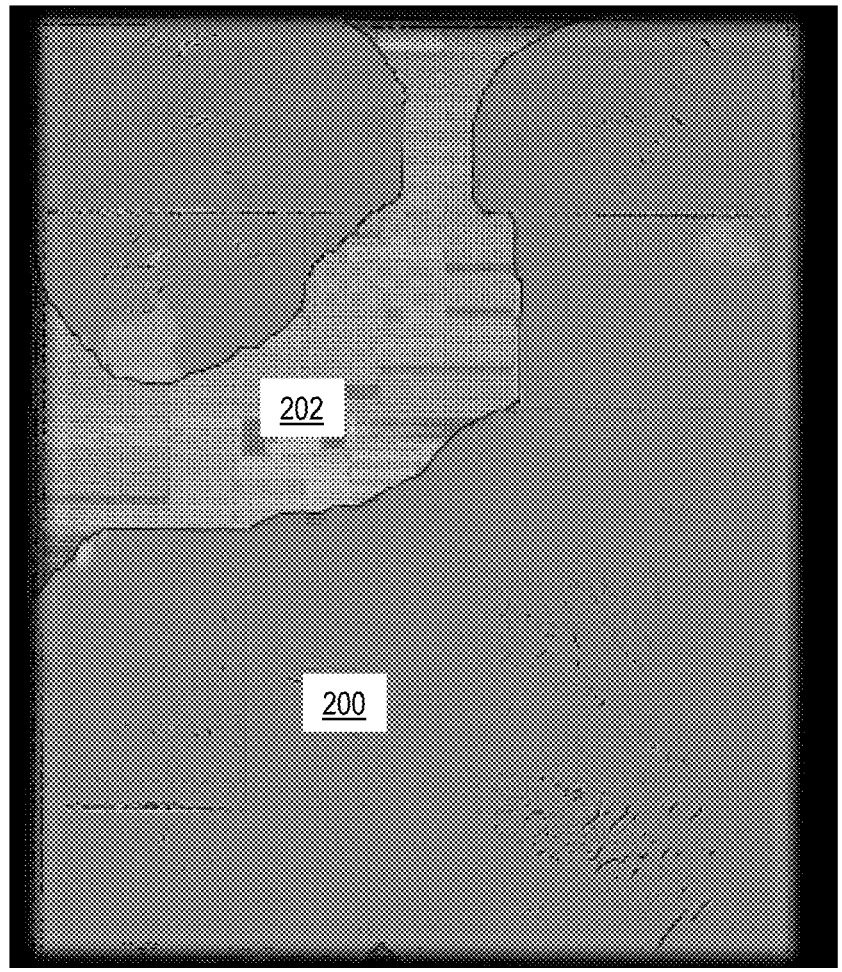
FIG. 2 depicts a top view of delamination of a semiconductor die due to moisture induced cracking.

FIG. 2 depicts a semiconductor die 200 on which a region 202 has been delaminated due to moisture induced cracking. In this case, a crack has propagated through and above the BEOL portion of the semiconductor die to cause the delamination. It will be appreciated that such mechanical failure impairs or completely prevents the functioning of the semiconductor device.

The skilled artisan will further appreciate that the depicted examples are "flip chips," but such techniques may be applied elsewhere. In FIGS. 1 and 3 (FIG. 3 is further discussed immediately below), the front-end-of-line (FEOL) features, not shown in detail, are oriented at the bottom adjacent to the silicon substrate, while the BEOL features such as the controlled collapse chip connection (C4) interconnects are on the top.

Embodiments of the disclosure mitigate circuit degradation by prohibiting entry of moisture into any microcracks that may be formed adjacent to a groove provided between a chip edge and a crack stop, i.e. outboard of the crack stop. For example, in an effort to mitigate moisture-induced crack propagation, FIG. 3 depicts a semiconductor die 300 with a laser etched groove 302 that is formed in an exposed surface 303 of the die 300 (in one or more embodiments, a moisture barrier layer 310 later is put down over the exposed surface 303). The groove 302 is filled by a moisture barrier material 304, according to an exemplary embodiment. In one or more embodiments, the laser etched groove 302 is formed in a kerf region 305 between a die edge 306 of the semiconductor die 300 and a crack stop 308. The groove 302 extends parallel to the die edge 306 and the crack stop 308. A crack stop is a mechanical structure that surrounds the periphery of the chip that is singulated from the wafer through dicing. The crack stop structure usually includes multilayer (of alternating insulating and conductive layers) and an anchor system extending from the stack layer to a predetermined point below the surface of the silicon substrate. The purpose of a crack stop is to provide good crack resistance and to anchor the stacked layer to the silicon substrate.

The semiconductor die 300 is formed on a silicon substrate 312 and also includes, for example, components such as a C4 solder ball 314, a front via 316, exemplary circuitry 318, an FEOL (front-end-of-line) layer 320, a low-k or ultra-low-k layer 322, an oxide layer 324, a photosensitive polyimide layer 326, an inboard crack stop 328, and a moisture barrier 330 inboard of the crack stops 308, 328. In one or more embodiments, failure of the circuitry 318 indicates that a crack has propagated around or through the crack stops 308, 328.

FIG. 4 shows a partial top view of pertinent aspects, with the moisture barrier layer 310 omitted for convenience of illustration. Notably, the moisture barrier material 304 is filled into the laser groove or trench 302, which is disposed between the kerf region 305 and the first (outboard) crack stop 308.

As will be appreciated by the skilled artisan, chip-package interaction typically includes thermally-induced stresses from mismatched coefficients of thermal expansion. For example, the chip typically expands and contracts at 3 ppm/° C., while the substrate it is placed on, typically an organic laminate chip carrier, which expands and contracts at 16-20 ppm/° C. (ppm=parts per million). The fluctuation of the environmental temperature, which could result from fluctuating ambient conditions, and/or the power on/off of the system which the device is part of, along with the coefficient of thermal expansion (CTE) mismatch among the components, leads to the thermomechanical stress.

Thermomechanical stresses can cause the device to fail in the form of low cycle fatigue, which could result for example in the failure of a moisture barrier, if it were just a thin film or coating. Failure of a thin film moisture barrier will enable moisture to penetrate deep into the die structure.

In this particular application, the CTE mismatch comes from three sources: 1) between the laminate (~16 ppm/° C.) and the chip (~3 ppm/° C.), which causes the package to deform with temperature, and results in fluctuating stress in the chip-package-interface; 2) between the metal (say copper 17 ppm/° C.) and dielectric (anywhere from 1 to 20 ppm/° C.) in the BEOL (at the top side of the semiconductor dies in FIGS. 1 and 3); 3) between the thin coating and its supporting substrate. From a structural perspective, metal loading variation along the groove leads to extremely non-uniform residual stresses after the laser grooving process and due to irregular topography. The stress concentration induced by the irregular geometry and/or residual stresses, when combined with the CTE mismatch related stresses described above, exacerbates the damage/debonding of a thin film moisture barrier coating.

In proving durability of a semiconductor die and package, stress testing can be carried out, for example, at 85° C. ambient and 85% relative humidity, to determine if a design is susceptible to failure via moisture ingress. An electronic package shall be designed to ensure the devices to function reliably for the designed service life accounting for various harsh conditions that may cause failures. The harsh condition can be due to mechanical, thermal, chemical reasons. A pristine thin coating, as mentioned above, is susceptible to debonding and cracking due to cyclic stresses. Once it is worn by the cyclic mechanical stresses, its desired role as a moisture barrier also fails.

In one or more embodiments, long-term moisture-related delamination is reduced or eliminated by filling a trench between the crack stop and the laser groove with the moisture barrier material 304, or the laser groove is itself filled after the grooving process, to reduce or eliminate pathways by which moisture might seep into the crack stop region over time.

Fully filling a trench with the moisture barrier material 304, as in one or more embodiments, reduces the irregular topography, or jagged edges from laser grooving or mechanical dicing and the associated stress risers, making the geometry smoother, thereby evening out the stress distribution. The completely filled groove structure is, therefore, more robust in resisting mechanical stress induced fatigue. Therefore, the moisture barrier material 304 that completely fills the groove (a full depth plug) does not exhibit failure due to cyclic mechanical stresses, and provides good moisture protection to the semiconductor structure, for example, the crack stop, for a significantly longer time than can be accomplished with a thin film moisture barrier coating.

In one or more embodiments, a further moisture barrier layer/film 310 (e.g., parylene) is applied in "shrink wrap" fashion over the entire upper surface and edges (i.e., side walls) of the semiconductor die after the primary moisture barrier material 304 has been filled into the trench or laser groove 302.

The moisture barrier material 304, as shown in FIG. 3, can be silicon nitride ($Si_3N_4$), tetraethylorthosilicate (TEOS), or any of a variety of molecular sieves (e.g., zeolites). In some non-limiting exemplary embodiments, such as the embodiment of FIG. 3, the moisture barrier material 304 is deposited to entirely fill the groove 302, without any intervening layers of material between the moisture barrier material 304 and the body of the semiconductor die 300 (i.e., substrate 312). An absence of intervening layers helps to ensure that the moisture barrier material 304 penetrates into and seals off any microcracks that are present at the edges of the groove 302. Additionally, the absence of intervening layers enhances the performance of the moisture barrier material 304 to mitigate the action of the laser groove as a stress riser for cyclic mechanical stresses such as thermal stresses. However, in other non-limiting exemplary embodiments, one or more intervening layers may be deposited between the body of the semiconductor die 300 (i.e., substrate 312) and the moisture barrier material 304. In one or more embodiments, as discussed above, an additional moisture barrier film 310 (parylene is a non-limiting example) is deposited over the semiconductor die, especially covering the vertical sidewalls and the C4 interconnect side of the singulated die, after the laser groove 302 has been filled with the moisture barrier material 304.

In one or more embodiments, it is particularly advantageous to provide a zeolite as the moisture barrier material. A zeolite may be formed in the groove 302 in light of the thesis by Jonas Hedlund of Lulea Tekniska Universitet, "Thin Films of Molecular Sieves", expressly incorporated by reference herein.

Certain embodiments of methods for depositing a moisture barrier material into the groove 302 include a preliminary step of masking the upper surface 303 of the semiconductor die 300 to prevent deposition of the moisture barrier material onto the upper surface 303. It is desirable to mask the upper surface 303 because deposition of the moisture barrier material may negatively impact the solder interconnection or underfill adhesion in downstream packaging operation.

One or more embodiments advantageously mitigate internal crack-stop degradation due to long-term ambient humidity exposure, as compared to prior-art techniques (e.g., the laser groove 302) which only address minimizing crack propagation from mechanical stresses such as saw-dicing of a wafer to singulate the chips. Indeed, one or more embodiments provide techniques to prevent damage to an otherwise mechanically robust, metal and stacked vias-based, crack stop. Such embodiments prevent the crack stop from getting degraded by long term exposure to ambient moisture and cyclic thermal stress during field use, by providing a moisture barrier 304 that fills the entire groove 302. Exemplary materials for the moisture barrier 304 may include low stress $Si_3N_4$, or molecular sieves, or TEOS.

One or more embodiments accordingly provide moisture barrier materials such as $Si_3N_4$, TEOS, zeolite film, etc. filling a secondary groove between a traditional (metalstack-based) crack stop and a laser groove or a saw diced channel, i.e. outboard of the crack stop, to prevent the inner circuits or optional guard ring from degrading during operation due to ambient moisture in a flip chip package. One or more embodiments extend to the BEOL, preventing damage to the crack stop in BEOL due to ambient moisture over long field use conditions.

Figure 5:
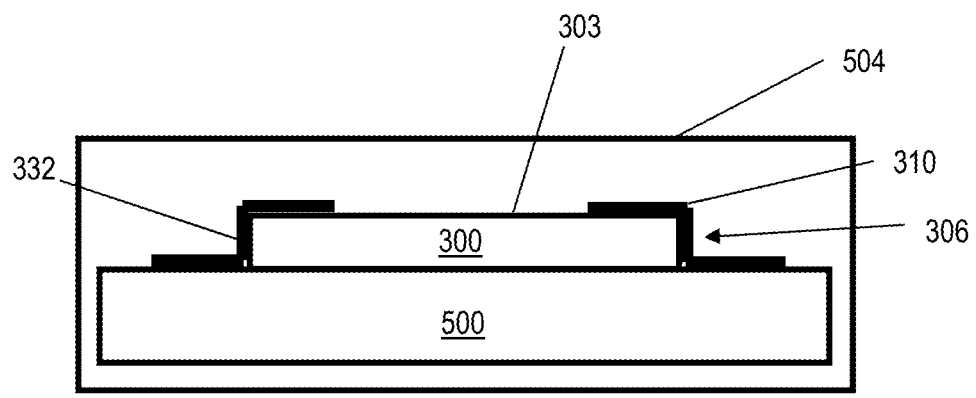
FIG. 5 depicts a side view of the semiconductor die shown in FIG. 3, mounted onto a carrier substrate inside a chip package, according to an exemplary embodiment.
Figure 6:
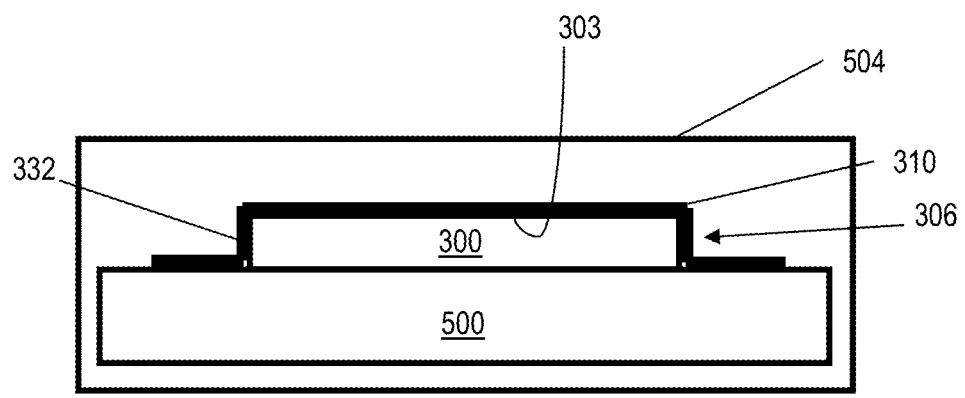
FIG. 6 depicts a side view of the semiconductor die shown in FIG. 3, mounted onto a carrier substrate inside a chip package, according to another exemplary embodiment.

With continued reference to FIGS. 3 and 4, and referring also now to FIG. 5 and FIG. 6, one or more embodiments also provide an additional line of defense in the form of a hydrophobic, mostly ubiquitous coating 310 of Parylene or the like to prevent moisture ingress. Such a coating 310 can be provided over the exposed upper surface 303 of the semiconductor die 300, after the laser groove 302 is filled with the primary moisture barrier material 304, and even on side walls 332 of the die after it is joined to a carrier substrate 500, which goes inside of a chip package 504 that encloses the semiconductor die 300. FIG. 6 shows complete coverage. As shown in FIG. 5, however, in one or more embodiments, the coating 310 is provided only on the carrier substrate 500 and side walls of the die 300; that is, most or all of the upper surface 303 of the die 300 is masked before applying the coating 310, then the mask is removed. Such embodiments allow a thermal interface material to be applied directly to the upper surface 303 without interference to adhesion of the thermal interface material and without an intervening thermal resistance from the coating 310. For some applications (e.g. low power die which does not require stringent cooling requirements) the presence of that layer may not be an issue so the embodiment of FIG. 6 can be used (simplifies process by eliminating masking step).

According to an aspect of the invention, an exemplary method includes forming a groove 302 in an upper surface 303 of a semiconductor die 300 between an edge 306 of the die 300 and a crack stop 308 that extends parallel to the edge of the die (i.e., the groove being formed outboard of the crack stop); and depositing a moisture barrier material 304 into the groove 302 to entirely fill the groove.

In one or more embodiments, the exemplary method also includes depositing a second moisture barrier material 310 over side walls of the semiconductor die 300, i.e. at the die edge 306.

In one or more embodiments, the exemplary method includes preventing deposition of the moisture barrier material 304 onto an upper surface 303 of the semiconductor die 300 by masking the upper surface before depositing the moisture barrier material into the groove 302.

In one or more embodiments, the moisture barrier material is silicon nitride.

In one or more embodiments, the moisture barrier material is a zeolite.

In one or more embodiments, the moisture barrier material is tetraethylorthosilicate.

In one or more embodiments, the second moisture barrier material is parylene.

In another aspect, an exemplary apparatus includes a semiconductor die 300 having an edge 306; a crack stop 308, formed in the die, that extends parallel to the die edge; a groove 302, formed in an upper surface of the die, that extends parallel to the crack stop between the crack stop and the die edge; and a moisture barrier material 304 that fills the entire depth of the groove.

In one or more embodiments, the moisture barrier material is silicon nitride.

In one or more embodiments, the moisture barrier material is a zeolite.

In one or more embodiments, the moisture barrier material is tetraethylorthosilicate.

In one or more embodiments, the apparatus also includes a second moisture barrier material 310 that is deposited over the side walls 332 of the die 300. In one or more embodiments, the apparatus also includes a carrier substrate 500 to which the die is attached, the second moisture barrier material covering the side walls of the die and at least a part of the top surface of the carrier substrate.

In one or more embodiments, the second moisture barrier material is parylene.

In another aspect, an exemplary method of mitigating moisture-driven degradation of a crack stop 308 in a semiconductor die 300 includes forming a groove 302 in the die 300 between an edge of the die 306 and the crack stop 308; entirely filling the groove 302 with a moisture barrier material 304, wherein the moisture barrier material 304 absorbs or adsorbs moisture or is hydrophobic (e.g., when exposed to ambient humidity). Further steps include preventing moisture penetration of the semiconductor die by presence of the moisture barrier material 304; and dissipating mechanical stress in the moisture barrier material 304 without presenting a stress riser in the bulk of the die.

In one or more embodiments, the exemplary method also includes preventing deposition of the moisture barrier material 304 onto the upper surface 303 of the die 300 by masking the upper surface of the die before depositing the moisture barrier material into the groove.

In one or more embodiments, the exemplary method includes attaching the die 300 to a chip carrier 500 and coating the side walls 332 of the die, and the top surface of the chip carrier, with a second moisture barrier material 310.

In one or more embodiments, the exemplary method also includes preventing deposition of the second moisture barrier material 310 onto the upper surface of the die by masking the upper surface of the die before depositing the second moisture barrier material. In some cases, top surface 303 could be coated as discussed elsewhere herein.

In one or more embodiments, the moisture barrier material is silicon nitride.

In one or more embodiments, the moisture barrier material is a zeolite.

In one or more embodiments, the moisture barrier material is tetraethylorthosilicate.

In one or more embodiments, the second moisture barrier material is parylene.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    a semiconductor die having an edge;
    an inboard crack stop, formed in the die, that extends parallel to the die edge;
    an outboard crack stop, formed in the die, that extends parallel to the die edge between the inboard crack stop and the die edge;
    a moisture barrier, embedded in the die, inboard of the inboard crack stop;
    a groove, formed in an upper surface of the die, that extends parallel to the crack stop between the outboard crack stop and the die edge; and
    a first moisture barrier material that fills the entire depth of the groove.

2. The apparatus of claim 1, wherein the moisture barrier material is silicon nitride.

3. The apparatus of claim 1, wherein the moisture barrier material is a zeolite.

4. The apparatus of claim 1, wherein the moisture barrier material is tetraethylorthosilicate.

5. The apparatus of claim 1, wherein the die has sidewalls, further comprising a carrier substrate to which the die is attached and a second moisture barrier material covering the die sidewalls and a top surface of the carrier substrate.

6. The apparatus of claim 5, wherein the second moisture barrier material is further deposited over an upper surface of the die.

7. The apparatus of claim 5, wherein the second moisture barrier material is parylene.

\* \* \* \* \*